(12) United States Patent
Kim

(10) Patent No.: US 9,093,472 B2
(45) Date of Patent: Jul. 28, 2015

(54) SEMICONDUCTOR DEVICE

(71) Applicant: SAMSUNG ELECTRONICS CO., LTD., Suwon-si, Gyeonggi-do (KR)

(72) Inventor: Min-Hwan Kim, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 47 days.

(21) Appl. No.: 14/014,675

(22) Filed: Aug. 30, 2013

(65) Prior Publication Data
US 2013/0344671 A1 Dec. 26, 2013

Related U.S. Application Data

(63) Continuation of application No. 13/448,850, filed on Apr. 17, 2012, now Pat. No. 8,530,965.

(30) Foreign Application Priority Data

May 27, 2011 (KR) .......................... 10-2011-0050929

(51) Int. Cl.
| | | |
|---|---|---|
| H01L 29/66 | (2006.01) | |
| H01L 29/00 | (2006.01) | |
| H01L 29/78 | (2006.01) | |
| H01L 29/10 | (2006.01) | |
| H01L 29/45 | (2006.01) | |
| H01L 29/06 | (2006.01) | |
| H01L 29/08 | (2006.01) | |

(52) U.S. Cl.
CPC .......... *H01L 29/66681* (2013.01); *H01L 29/00* (2013.01); *H01L 29/0696* (2013.01); *H01L 29/1095* (2013.01); *H01L 29/66689* (2013.01); *H01L 29/7816* (2013.01); *H01L 29/0653* (2013.01); *H01L 29/0878* (2013.01); *H01L 29/456* (2013.01)

(58) Field of Classification Search
USPC ................. 257/343, 337, 335, 299, 305, 142, 257/E21.417, E21.452, E21.455
See application file for complete search history.

(56) References Cited

U.S. PATENT DOCUMENTS

| | | | |
|---|---|---|---|
| 7,655,980 B1 * | 2/2010 | Chao et al. ..................... 257/335 |
| 2004/0002196 A1 * | 1/2004 | Lee et al. ........................ 438/301 |
| 2007/0057321 A1 | 3/2007 | Kikuchi et al. |
| 2008/0246084 A1 * | 10/2008 | Ono et al. ..................... 257/341 |
| 2010/0001343 A1 | 1/2010 | Choi et al. |
| 2010/0237413 A1 * | 9/2010 | Kasai ............................ 257/336 |
| 2012/0286359 A1 * | 11/2012 | Lin et al. ....................... 257/335 |

FOREIGN PATENT DOCUMENTS

| | | |
|---|---|---|
| JP | 2007-258283 | 10/2007 |
| KR | 1020010045901 | 6/2001 |
| KR | 1020080101438 | 11/2008 |

* cited by examiner

*Primary Examiner* — Julia Slutsker
(74) *Attorney, Agent, or Firm* — F. Chau & Associates, Inc.

(57) ABSTRACT

A semiconductor device comprising a substrate in which a first region and a second region are defined, a gate line which extends in a first direction and traverses the first region and the second region, a source region including a portion formed in the first region, a first part of a body region which is formed under the portion of the source region in the first region and has a first width, a first well which is formed under the first part of the body region in the first region and has a second width greater than the first width, a second part of the body region which is formed in the second region and has a third width, and a second well which is formed under the second part of the body region in the second region and has a fourth width smaller than the third width.

20 Claims, 15 Drawing Sheets

ELECTRON CURRENT FLOW $b_1 > a_1$ $b_2 < a_2$

ELECTRON CURRENT FLOW

HOLE CURRENT FLOW $b_1 > a_1$ $b_2 < a_2$

SEMICONDUCTOR DEVICE

This application is a continuation application of co-pending U.S. application Ser. No. 13/448,850 filed Apr. 17, 2012, which claims priority from Korean Patent Application No. 10-2011-0050929 filed on May 27, 2011 in the Korean Intellectual Property Office, the disclosures of which are each hereby incorporated by reference herein in their entireties.

TECHNICAL FIELD

The present inventive concept relates to a semiconductor device, and more particularly, to a lateral double diffused metal-oxide semiconductor field-effect transistor (MOSFET).

DISCUSSION OF THE RELATED ART

A power metal-oxide field-effect transistor (MOSFET) has a higher power gain and a simpler gate driving circuit than a bipolar transistor. In addition, when the power MOSFET is turned off, there is no time delay due to accumulation or recombination of minority carriers. Therefore, the power MOSFET has been widely used as a control, logic and power switch.

An example of the power MOSFET is a double diffused MOSFET (DMOS) using double diffusion technology, such as a lateral DMOS (LDMOS).

When a parasitic NPN transistor in an LDMOS is turned on, a semiconductor device may be permanently damaged. Therefore, there is a need to delay or prevent the turn-on of the parasitic NPN transistor in a double diffused MOSFET.

SUMMARY

Aspects of the present inventive concept provide a semiconductor device in which a current path formed in a relatively low base resistance region of a parasitic NPN transistor can delay the turn-on of the parasitic NPN transistor, but are not limited thereto.

According to an embodiment of the present inventive concept, there is provided a semiconductor device comprising a substrate in which a first region and a second region are defined, a gate line which extends in a first direction and traverses the first region and the second region, a portion of a source region which is formed in the first region, a first part of a body region which is formed under the portion of the source region in the first region and has a first width, a first well which is formed under the first part of the body region in the first region and has a second width greater than the first width, a second part of the body region which is formed in the second region and has a third width, and a second well which is formed under the second part of the body region in the second region and has a fourth width smaller than the third width.

According to an embodiment of the present inventive concept, there is provided a semiconductor device comprising a substrate, a well formed in the substrate in a shape of a fishbone antenna, a body region which is formed on the well in the substrate and extends in a lengthwise direction of the well, a source region which is formed in the body region, and a gate line which is formed on the substrate and on a side of the source region and extends in the lengthwise direction of the well.

A semiconductor device, in accordance with an embodiment of the inventive concept, comprises a substrate, a well formed in the substrate, wherein the well comprises a first portion extending in a first direction, and a plurality of second portions extending from opposite sides of the first portion in a second direction perpendicular to the first direction, a body region formed on the well in the substrate and extending in the first direction, a source region formed in the body region; and a gate line formed on the substrate and on a side of the source region and extending in the first direction.

BRIEF DESCRIPTION OF THE DRAWINGS

The embodiments of the present inventive concept will become more apparent by describing in detail exemplary embodiments thereof with reference to the attached drawings, in which:

FIG. 9 is a conceptual diagram illustrating the flow of electron current when the semiconductor device of FIG. 1 is turned on;

DETAILED DESCRIPTION OF THE EMBODIMENTS

Figure 1:
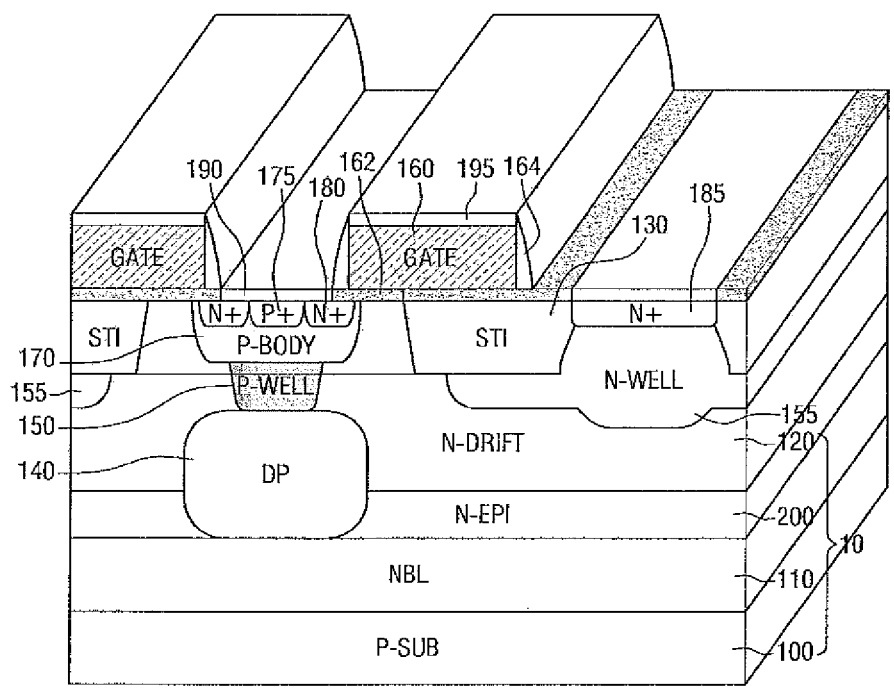
FIG. 1 is a perspective view of a semiconductor device according to an exemplary embodiment of the present inventive concept.

Embodiments of the present inventive concept and methods of accomplishing the same may be understood more readily by reference to the following detailed description of exemplary embodiments and the accompanying drawings. The present inventive concept may, however, be embodied in many different forms and should not be construed as being limited to the embodiments set forth herein. In the drawings, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present. Like numbers may refer to like elements throughout. As used herein, the term "and/or" includes any and all combinations of one or more of the associated listed items.

As used herein, the singular forms "a", "an" and "the" are intended to include the plural forms as well, unless the context clearly indicates otherwise.

Hereinafter, exemplary embodiments of the present inventive concept will be described using a semiconductor device having N-type source and drain regions. However, one of ordinary skill in the art will understands that the embodiments of the present invention can also be applied to a semiconductor device having P-type source and drain regions. For example, a P type stated in the present specification may be changed to an N type, and the N type may be changed to the P type. Accordingly, the embodiments of the present inventive concept may be applied to a semiconductor device having P-type source and drain regions.

Figure 2:
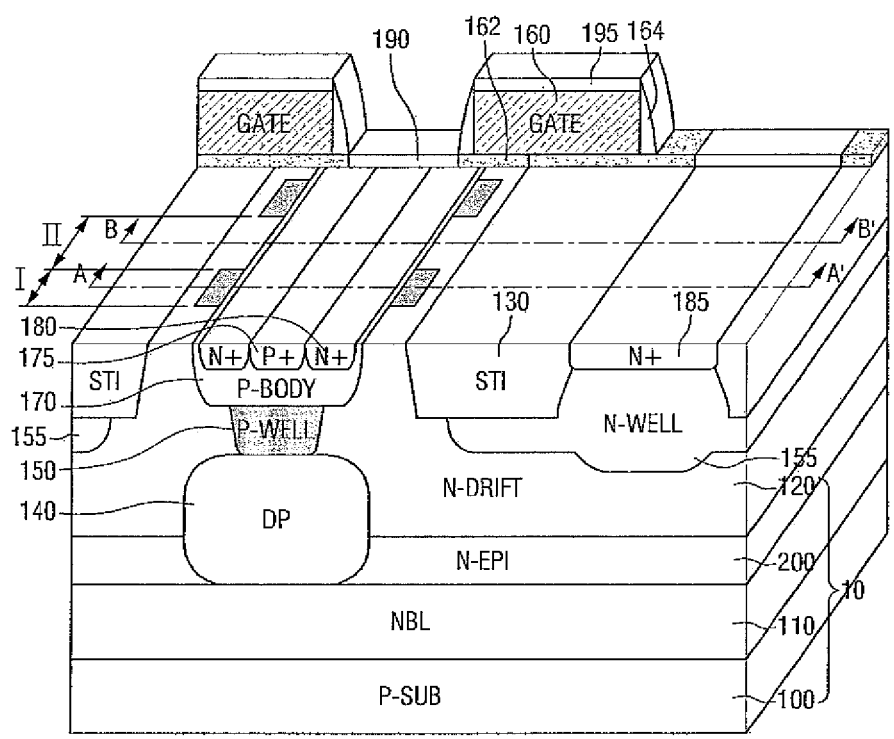
FIG. 2 is a perspective view of the semiconductor device of FIG. 1, a portion of which has been cut away.
Figure 3:
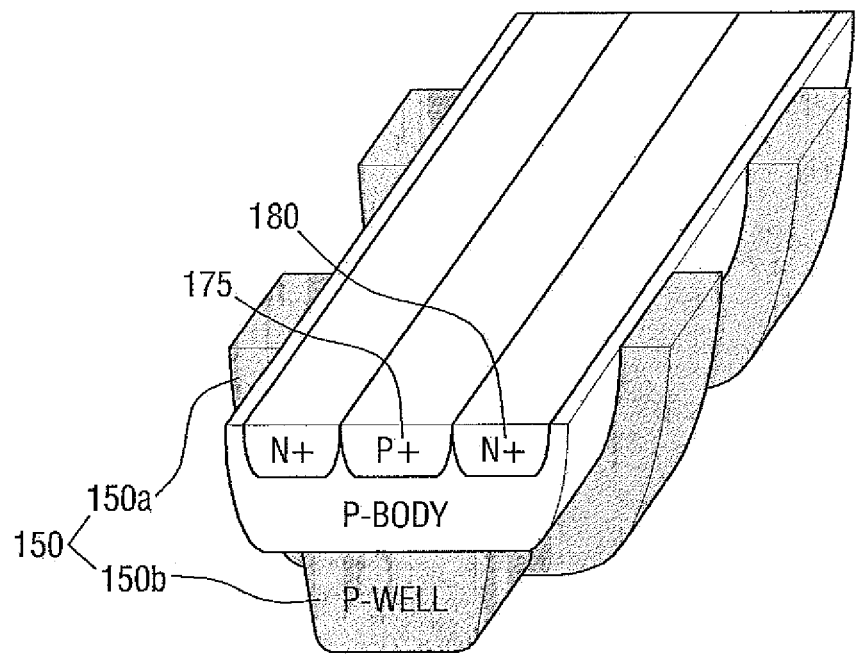
FIG. 3 is a perspective view of some components of the semiconductor device of FIG. 1.
Figure 4:
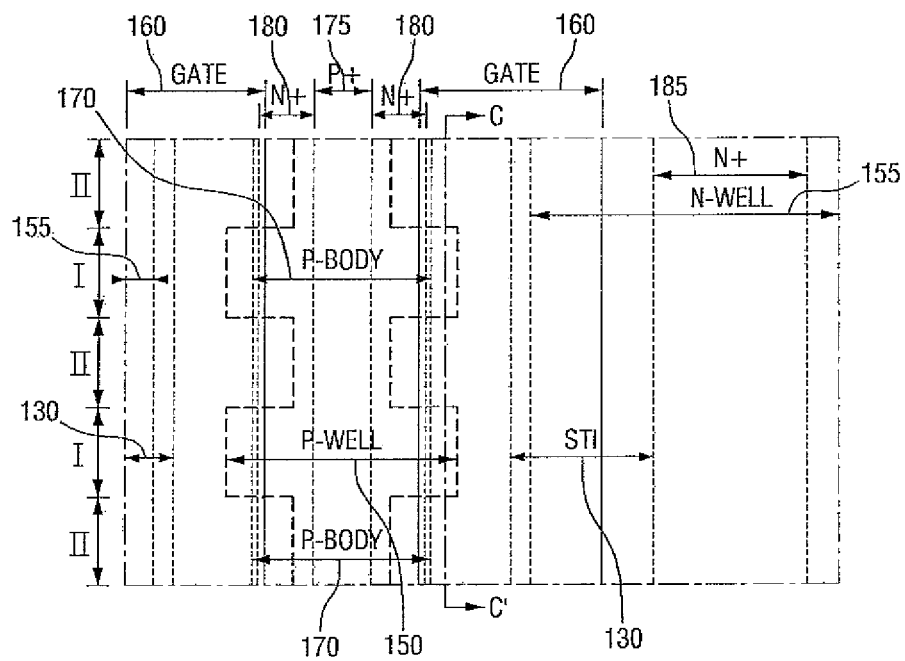
FIG. 4 is a conceptual plan view of the semiconductor device of FIG. 1.
Figure 5:
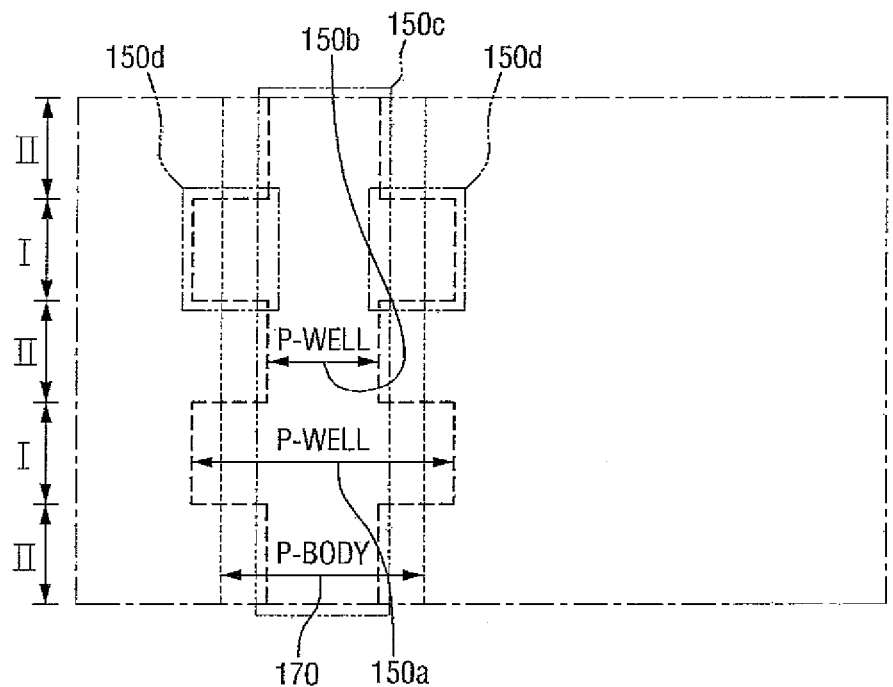
FIG. 5 is a conceptual plan view of some components of the semiconductor device of FIG. 1.
Figure 6:
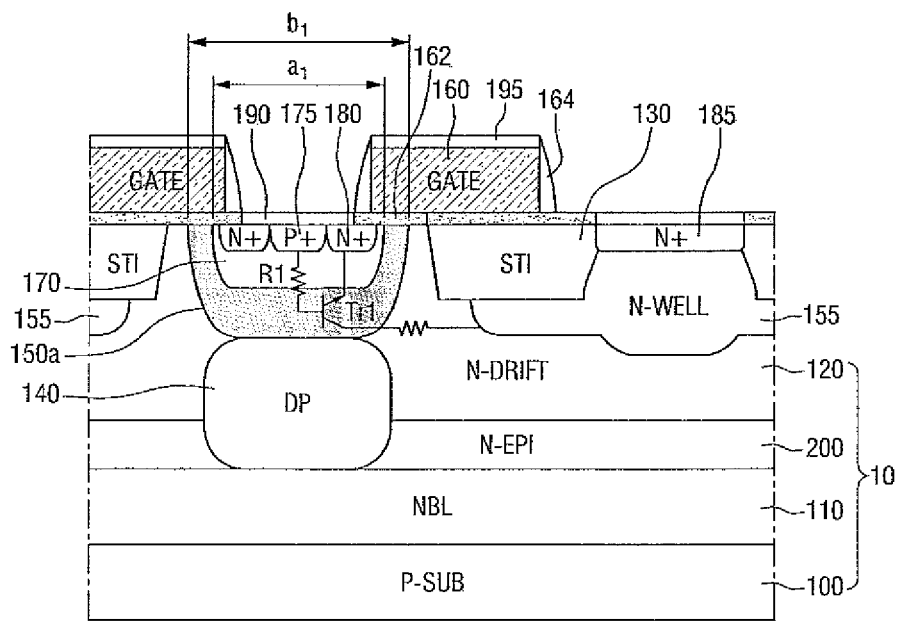
FIG. 6 is a cross-sectional view of the semiconductor device, taken along the line A-A' of FIG. 2.
Figure 7:
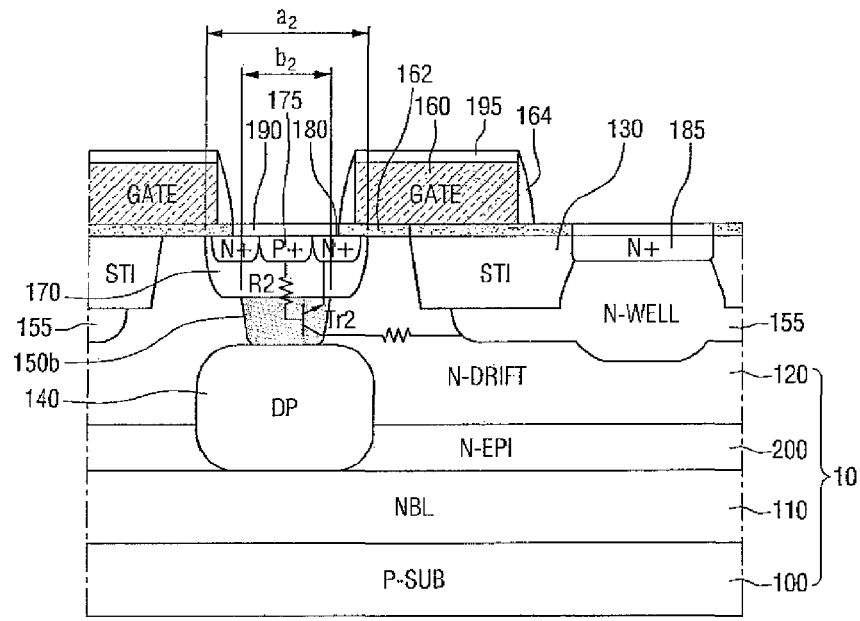
FIG. 7 is a cross-sectional view of the semiconductor device, taken along the line B-B' of FIG. 2.

A semiconductor device according to an exemplary embodiment of the present inventive concept is described with reference to FIGS. 1 through 10. FIG. 1 is a perspective view of a semiconductor device according to an exemplary embodiment of the present inventive concept. FIG. 2 is a perspective view of the semiconductor device of FIG. 1, a portion of which has been cut away. FIG. 3 is a perspective view of some components of the semiconductor device of FIG. 1. FIG. 4 is a conceptual plan view of the semiconductor device of FIG. 1. FIG. 5 is a conceptual plan view of some components of the semiconductor device of FIG. 1. FIG. 6 is a cross-sectional view of the semiconductor device, taken along the line A-A' of FIG. 2. FIG. 7 is a cross-sectional view of the semiconductor device, taken along the line B-B' of FIG. 2.

Figure 8:
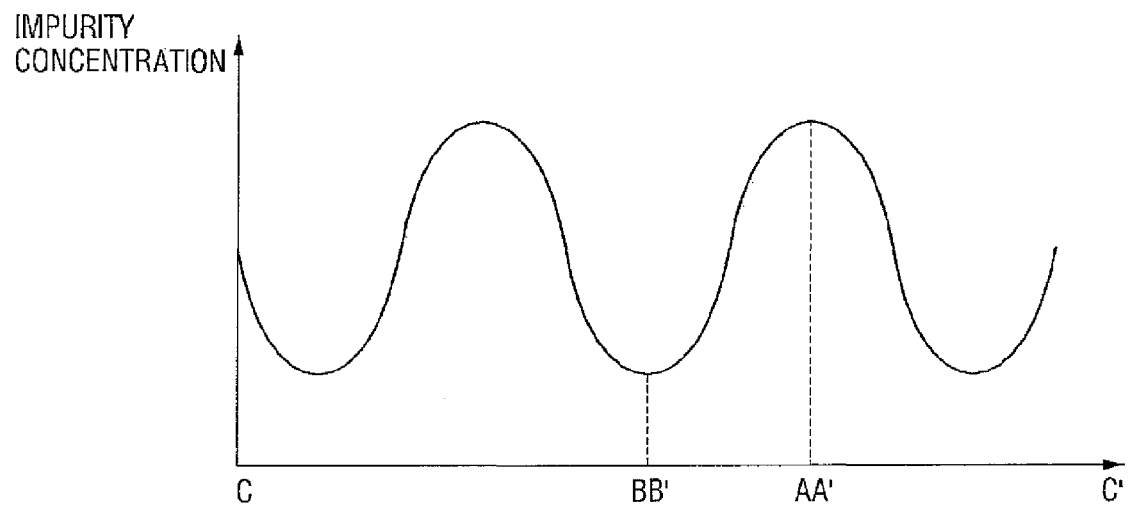
FIG. 8 is a graph illustrating the concentration of P-type impurities measured along the line C-C' of FIG. 4.
Figure 9:
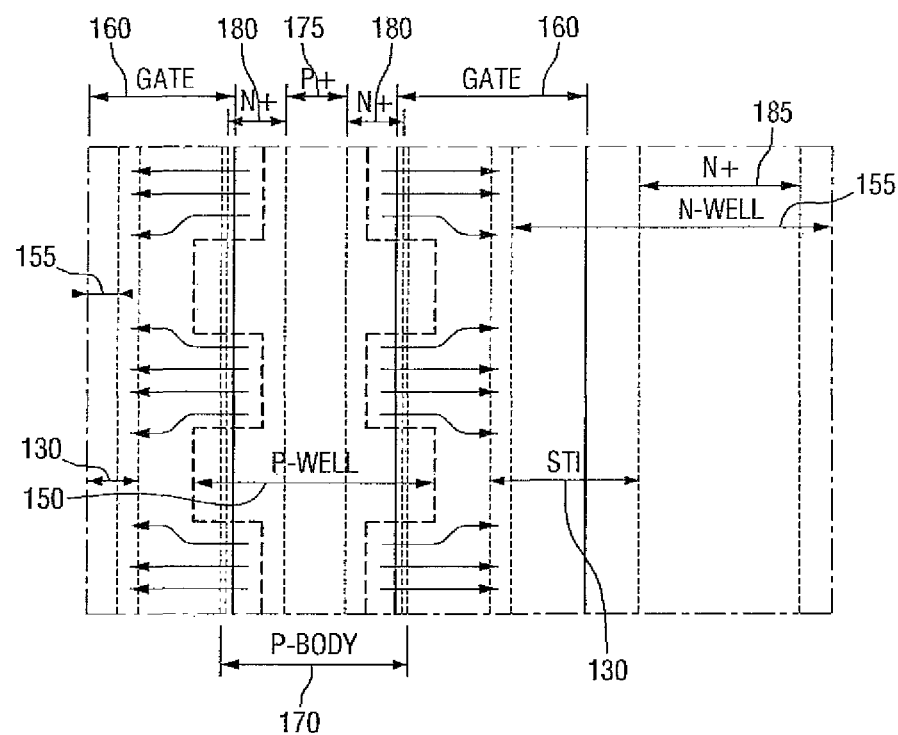
Figure 10:
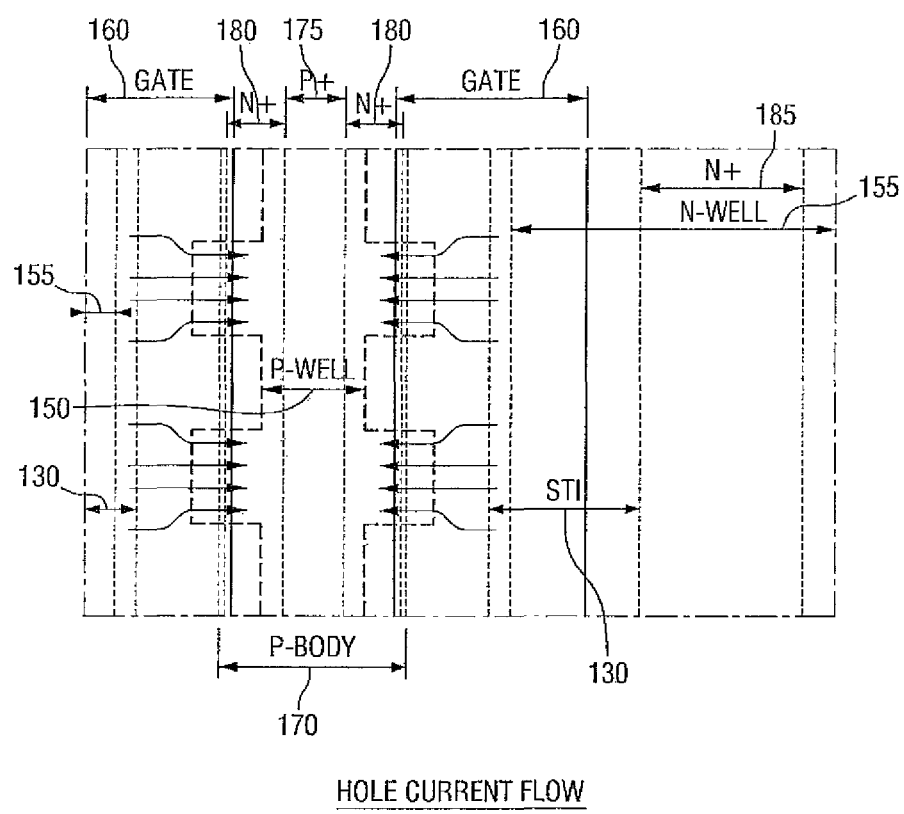
FIG. 10 is a conceptual diagram illustrating the flow of hole current when the semiconductor device of FIG. 1 is turned off.

FIG. 8 is a graph illustrating the concentration of P-type impurities measured along the line C-C' of FIG. 4. FIG. 9 is a conceptual diagram illustrating the flow of electron current when the semiconductor device of FIG. 1 is turned on. FIG. 10 is a conceptual diagram illustrating the flow of hole current when the semiconductor device of FIG. 1 is turned off.

Referring to FIGS. 1 through 5, a semiconductor device according to an exemplary embodiment includes a substrate 10, a P-type well 150 having a shape like a fishbone antenna, which is formed in the substrate 10, a body region 170 which is formed on the P-type well 150 within the substrate 10 and extends in a lengthwise direction of the P-type well 150. A fishbone antenna is an antenna having a series of coplanar elements arranged in collinear pairs. The semiconductor device also includes a source region 180 formed in the body region 170, and a gate line 160 formed on the substrate 10 and on a side of the source region 180. The gate line 160 extends in the lengthwise direction of the P-type well 150.

In accordance with an embodiment of the inventive concept, the substrate 10 includes a P-type bulk substrate 100, an N-type buried layer 110, an N-type epitaxial layer 200, and an N-type drift region 120. The bulk substrate 100, the buried layer 110, the epitaxial layer 200 and the drift region 120 may be, for example, sequentially stacked.

The bulk substrate 100 contains, e.g., P-type impurities. The bulk substrate 100 can be, for example, a silicon, gallium arsenic, silicon germanium, ceramic, quartz, or glass semiconductor substrate.

The buried layer 110, the epitaxial layer 200, and the drift region 120 can be sequentially stacked on the bulk substrate 100. The buried layer 110, the epitaxial layer 200 and the drift region 120 contain, e.g., N-type impurities. In accordance with an embodiment of the inventive concept, the (doping) concentration of impurities is highest in the buried layer 110 and lowest in the epitaxial layer 200.

The drift region 120 has a higher concentration of impurities than the epitaxial layer 200. Therefore, when a voltage equal to or higher than a threshold voltage is applied to the source region 180 and a drain region 185, more current flows through the drift region 120 than through the epitaxial layer 200. Since current can easily flow through a current path formed in the drift region 120, the turn-on resistance of the semiconductor device can be reduced.

A deep well 140 is formed on the buried layer 110. In accordance with an embodiment of the inventive concept, side surfaces of the deep well 140 are surrounded by, e.g., the epitaxial layer 200 and the drift region 120. The deep well 140 contains, e.g., P-type impurities. The deep well 140 can increase a breakdown voltage of the semiconductor device.

The P-type well 150 is formed within the substrate 10 and on the deep well 140, and, in accordance with an embodiment of the inventive concept, has a shape like a fishbone antenna, having a central section, and branches extending from the central section. For example, referring to FIGS. 4 and 5, when seen from above, the P-type well 150 is shaped like a fishbone antenna.

A fishbone antenna can include a transmission line which corresponds to a main bone that goes through the entire fishbone antenna and a plurality of dipoles which correspond to bones branching off from the main bone. In other words, a fishbone antenna is structured such that a plurality of dipoles are arranged at regular intervals along a lengthwise direction of a transmission line and with respect to the transmission line extending in a lengthwise direction of the fishbone antenna.

Referring to FIG. 5, the P-type well 150 includes a first sub well 150c extending in the lengthwise direction of the P-type well 150 and a plurality of second sub wells 150d extending from both sides of the first sub well 150c. In accordance with an embodiment of the inventive concept, the second sub wells 150d extend from the first sub well 150c in a direction perpendicular to the lengthwise direction of the P-type well 150. In addition, the second sub wells 150d are arranged at regular intervals along the lengthwise direction of the P-type well 150. For example, a gap between neighboring second sub wells 150d can be, but is not limited to, equal to a width of the second sub wells 150d. Therefore, the first sub well 150c corresponds to a transmission line of a fishbone antenna, and the second sub wells 150d correspond to dipoles of the fishbone antenna.

The second sub wells 150d protrude laterally compared with the first sub well 150c to expand toward the drain region 185. In accordance with an embodiment of the inventive concept, a portion of each of the second sub wells 150d is disposed under the gate line 160 and thus is overlapped by a portion of the gate line 160.

Portions of the P-type well 150 where the second sub wells 150d are formed are wider than portions of the P-type well 150 where only the first sub well 150c is formed. For example, the portions of the P-type well 150 where the second sub wells 150d are formed are wider than the body region 170, and portions of the P-type well 150 where only the first sub well 150c is formed are narrower than the body region 170.

The body region 170 is formed on the P-type well 150 and extends in the lengthwise direction of the P-type well 150. In addition, the body region 170 is formed under the source region 180 and surrounds the area under and to the side of the source region 180. According to an embodiment, unlike the P-type well 150, the body region 170 has a constant width.

A body contact region 175 is formed in the body region 170 and extends in the lengthwise direction of the P-type well 150. The body region 170 and the body contact region 175 contain, e.g., P-type impurities. According to an embodiment, the body contact region 175 can have a higher concentration of impurities than the body region 170. In addition, the body region 170 can have a higher concentration of impurities than the P-type well 150, and the P-type well 150 can have a higher concentration of impurities than the deep well 140.

The source region 180 is formed within the body region 170 and extends in the lengthwise direction of the P-type well 150. The source region 180 is located on side surfaces of the body contact region 175 and extends parallel to the body contact region 175 along the lengthwise direction of the P-type well 150. For example, according to an embodiment, the source region 180 is located on both sides of the body contact region 175. The source region 180 contains, e.g., N-type impurities.

Since the N-type buried layer 110 is positioned between the P-type deep well 140 and the P-type bulk substrate 100, the N-type source region 180 is electrically insulated from the P-type bulk substrate 100. Therefore, a voltage different from a voltage applied to the bulk substrate 100 can be applied to the source region 180.

According to an embodiment, a silicide film pattern 190 is formed on the source region 180 and the body contact region 175. A contact (not shown) is formed on the silicide film pattern 190. Since the silicide film pattern 190 is in contact with the source region 180, the contact (not shown) can be formed at any position on the silicide film pattern 190. In addition, in accordance with an embodiment of the inventive concept, the silicide film pattern 190 reduces the resistance between the source region 180 and the contact (not shown).

The gate line 160 is formed on the substrate 10 and on a side of the source region 180. The gate line 160 extends in the lengthwise direction of the. P-type well 150. A region of the gate line 160 overlaps the source region 180. However, embodiments of the present inventive concept are not limited to this configuration of the gate line 160. The gate line 160 may contain, e.g., polysilicon. Alternatively, the gate line 160 may contain, e.g., metal or a combination of metal and polysilicon. That is, the gate line 160 may contain various conductive materials.

A gate insulating film pattern 162 can be formed under the gate line 160. For example, the gate insulating film pattern 162 can be situated between the substrate 10 and the gate line 160. Gate spacers 164 can be formed on both side surfaces of the gate line 160, and a gate hard film pattern 195 can be formed on the gate line 160. The gate spacers 164 and the gate hard film pattern 195 protect the gate line 160.

The drain region 185 is formed on a side of the gate line 160. For example, in accordance with an embodiment of the inventive concept, the drain region 185 is formed on a side of the gate line 160, and the source region 180 is formed on the other side of the gate line 160. The drain region 185 contains, e.g., N-type impurities.

According to an embodiment, the silicide film pattern 190 is formed on the drain region 185, and a contact (not shown) is formed on the silicide film pattern 190. The silicide film pattern 190 can reduce the resistance between the drain region 185 and the contact (not shown).

An N-type well 155 is formed under the drain region 185 and an element isolation region 130. The N-type well 155 contains N-type impurities. In accordance with an embodiment of the inventive concept, the N-type well 155 has a lower concentration of impurities than the source region 180 and a higher concentration of impurities than the drift region 120.

The element isolation region 130 is formed between the body region 170 and the drain region 185. More specifically, the element isolation region 130 is disposed under the gate line 160, and a portion of the element isolation region 130 is overlapped by the gate line 160. The element isolation region 130 separates the gate line 160 from the drain region 185. This prevents the deterioration of the semiconductor device due to a high electric field formed between edges of the drain region 185 and the gate line 160 when a high voltage is applied to the drain region 185. The element isolation region 130 is formed using, e.g., a shallow trench isolation (STI) method or a local oxidation of silicon (LOCOS) method.

The fishbone-antenna shaped P-type well 150 of the semiconductor device according to the current exemplary embodiment is described in further detail with reference to FIGS. 6 and 7. The P-type well 150 located in a first region I is referred to as a first well 150$a$, and the P-type well 150 located in a second region II is referred to as a second well 150$b$.

The semiconductor device according to an exemplary embodiment includes the substrate 10 in which the first region I and the second region II are defined, the gate line 160 which extends in a first direction, overlaps the first region I, the second region II, and a source region 180. Part of the source region 180 is formed in the first region I. Part of the body region 170 is formed under the source region 180 in the first region I and has a first width a1. The first well 150$a$ is formed under the body region 170 in the first region I and has a second width b1 greater than the first width a1. Part of the source region 180 is fanned in the second region II, and a part of the body region 170 is formed under the source region 180 in the second region II and has a third width a2. When the width of the body region is constant, the first width a1 is equal to the third width a2. The second well 150$b$ is formed under the body region 170 in the second region II and has a fourth width b2 smaller than the third width a2.

Referring to FIGS. 2, 4 and 5, the substrate 10 includes the first region I and the second region II. The first region I is defined as a region in which the P-type well 150 is wider than the body region 170. That is, the first region I of the substrate 10 includes a region in which a width of the P-type well 150 is increased by the second sub wells 150$d$. The second region II is defined as a region in which the P-type well 150 is narrower than the body region 170. That is, the second region II of the substrate 10 includes a region in which only the first sub well 150$c$ is formed and thus the P-type well 150 is narrower than in the first region I.

The gate line 160 extends in the first direction and overlaps the first region I and the second region II. Specifically, the gate line 160 is disposed on the substrate 10, and the gate insulating film pattern 162 is interposed between the substrate 10 and the gate line 160. The gate spacers 164 are formed on both sides of the gate line 160, and the gate hard film pattern 195 is formed on the gate line 160. The gate insulating film pattern 162, the gate spacers 164, and the gate hard film pattern 195 extend in the first direction. According to an embodiment, the first direction is, but is not limited to, the lengthwise direction of the P-type well 150.

Referring to a cross section of the first region I of the semiconductor device in FIG. 6, the first region I includes part of the body region 170, which is formed under part of the source region 180 and has the first width a1, and the first well 150$a$, which is formed under the body region 170 in the first region I, and has the second width b1 greater than the first width a1.

The first well 150a surrounds the body region 170 in the first region I. Referring to FIGS. 6 and 7, the first well 150a extends further toward the drain region 185 than the second well 150b. For example, a region of the first well 150a is disposed under the gate line 160 and is overlapped by the gate line 160.

Referring to a cross section of the second region II of the semiconductor device in FIG. 7, the second region II includes part of the source region 180, part of the body region 170, which is formed under the source region 180 and has the third width a2, and the second well 150b, which is formed under the body region 170 in the second region II, and has the fourth width b2 smaller than the third width a2.

The second well 150b is located under the body region 170, and a top surface of the second well 150b is in contact with a bottom surface of the body region 170 in the second region II.

The substrate 10 includes a plurality of the first regions I and a plurality of the second regions II. The first regions I and the second regions II can be arranged successively and alternately. According to an embodiment, a width of the first regions I can be, but is not limited to, equal to that of the second regions II.

In accordance with an embodiment of the inventive concept, the first width a1. of the body region 170 in the first region I is equal to the second width a2 of the body region 170 in the second region II. The second width b1 of the first well 150a in the first region I is greater than the fourth width b2 of the second well 150b in the second region II. Therefore, when the first and second regions I and II are arranged successively and alternately, the width of the P-type well 150 is not constant, but varies between the second width b1 and the fourth width b2. Consequently, the P-type well 150 is shaped like a fishbone antenna whose width varies periodically.

Accordingly, the P-type well 150 does not completely surround the bottom and sides of the body region 170. For example, in accordance with an embodiment of the inventive concept, the P-type well 150 completely surrounds the bottom and sides of the body region 170 in the first region I, but partially surrounds the bottom of the body region 170 in the second region II. Therefore, the on resistance $R_{on}$ of the semiconductor device can be reduced compared with when the P-type well 150 completely surrounds the bottom and sides of the body region 170.

FIG. 8 is a graph illustrating the concentration of P-type impurities measured along the line C-C' of FIG. 4. Referring to the graph, the concentration of P-type impurities varies periodically. The line C-C' traverses protruding regions (i.e., the P-type second sub wells 150d) of the P-type well 150. The concentration of P-type impurities measured in regions in which the second sub wells 150d are formed is relatively high, and the concentration of P-type impurities measured in regions in which the second sub wells 150d are not formed is relatively low.

Referring to FIGS. 9 and 10, when the semiconductor device is turned on, an electron current flows from the source region 180 to the drain region 185. When the semiconductor device is turned off, a hole current flows from the drain region 185 to the source region 180 due to electrons accelerated when the semiconductor device was turned on.

Referring to FIGS. 6 and 7, the semiconductor device according to the exemplary embodiment includes a parasitic NPN transistor. When a parasitic NPN transistor is turned on, the semiconductor device can be permanently damaged. For example, when a current flows to base resistance of the parasitic NPN transistor, a voltage high enough to turn on the parasitic NPN transistor may be generated. Accordingly, the semiconductor device may be turned off while the parasitic NPN transistor is turned on by a hole current flowing to the base resistance. As a result, the semiconductor device may be damaged.

The semiconductor device according to the exemplary embodiment is structured to delay the turn-on of a parasitic NPN transistor. For example, the fishbone-antenna shaped P-type well 150 provides a path, through which a hole current can flow out, in order to delay the turn-on of the parasitic NPN transistor.

The base resistance of the parasitic NPN transistor is affected by the P-type well 150. Since the P-type well 150 is shaped like a fishbone antenna, the first well 150a in the first region I is wider than the second well 150b in the second region II. Accordingly, a cross section of the first well 150a in the first region I is wider than that of the second well 150b in the second region II. The magnitude of resistance is inversely proportional to the cross-sectional area of the well. Therefore, base resistance R1 of a parasitic NPN transistor Tr1 in the first region I is smaller than base resistance R2 of a parasitic NPN transistor Tr2 in the second region II. The base resistance R1 of the parasitic NPN transistor Tr1 may be in a range of several tens of ohms ($\Omega$), and the base resistance R2 of the parasitic NPN transistor Tr2 may be in a range of several to several hundreds of kilo ohms (K$\Omega$).

Current tends to flow to a region with low resistance. For example, the hole current may flow more to a region with relatively low P-type resistance than to a region with higher P-type resistance. Referring to FIG. 10, a hole current path is formed along the first region I with relatively low base resistance. Therefore, the hole current hardly flows to the second region II with relatively high resistance and flows to the first region I with relatively low resistance along the hole current path.

Since the hole current hardly flows to the first region I, or is substantially less in the first region I in which the base resistance R1 of the parasitic NPN transistor Tr1 is relatively high, the parasitic NPN transistor Tr1 in the first region I is not provided with a required voltage to turn on the transistor Tr1. In addition, in the second region II to which the hole current flows, since the base resistance R2 of the parasitic NPN transistor Tr2 is small, the parasitic NPN transistor Tr2 is also not provided with a required voltage to turn on the transistor Tr2. Consequently, parasitic NPN transistors of the semiconductor device according to the exemplary embodiment are not provided with the required turn-on voltages, thus delaying the turn-on of the parasitic NPN transistors.

Delaying the turn-on of the parasitic NPN transistors by the hole current as described above can enhance electrostatic discharge (ESD) and single avalanche energy (EAS) capabilities of the semiconductor device. As a result, the reliability of the semiconductor device can be improved.

Figure 11:
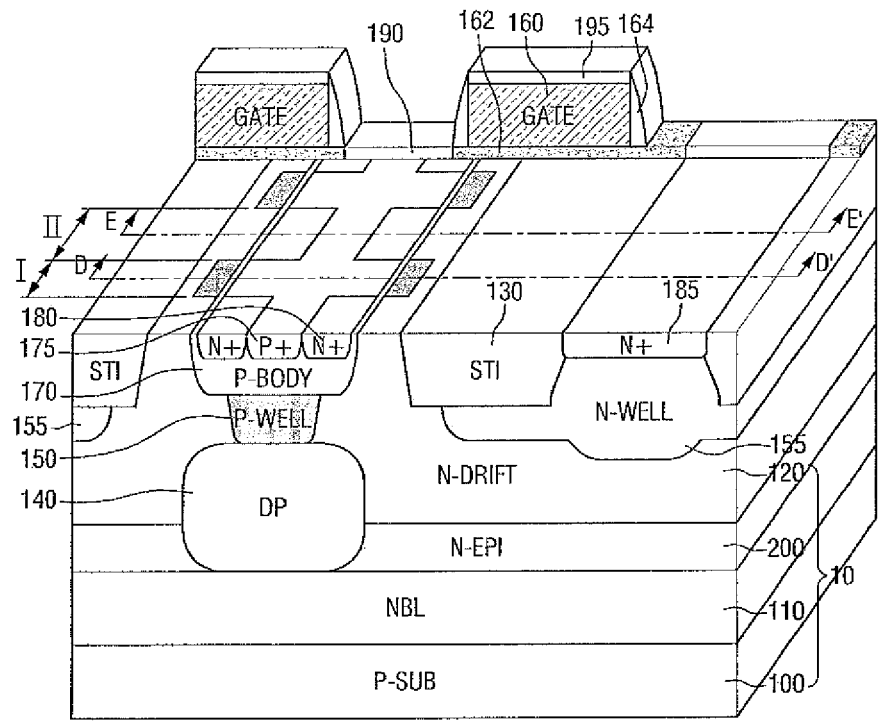
FIG. 11 is a perspective view of a semiconductor device according to an exemplary embodiment of the present inventive concept, a portion of which has been cut away.
Figure 12:
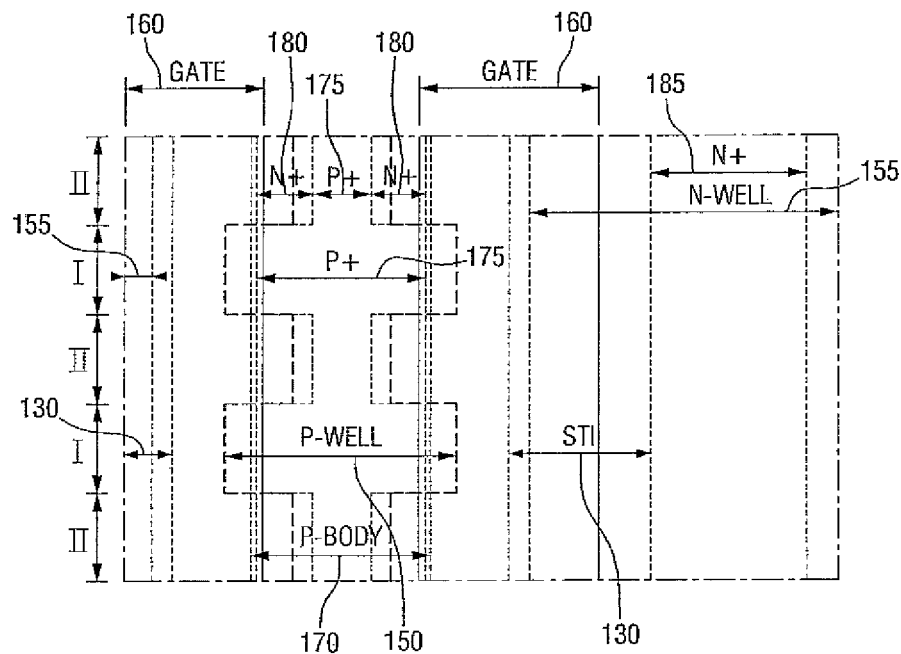
FIG. 12 is a conceptual plan view of the semiconductor device of FIG. 11.
Figure 13:
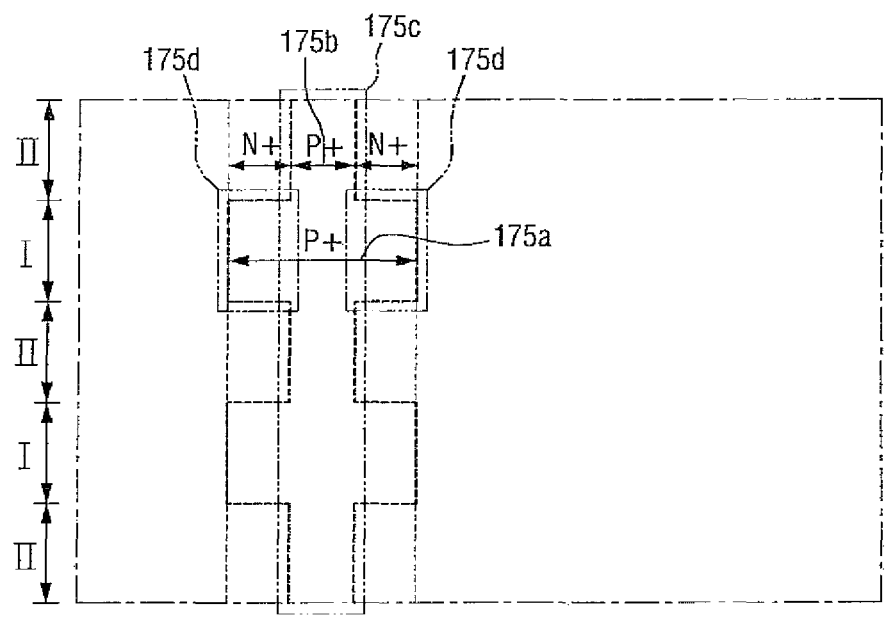
FIG. 13 is a conceptual plan view of some components of the semiconductor device of FIG. 11.
Figure 14:
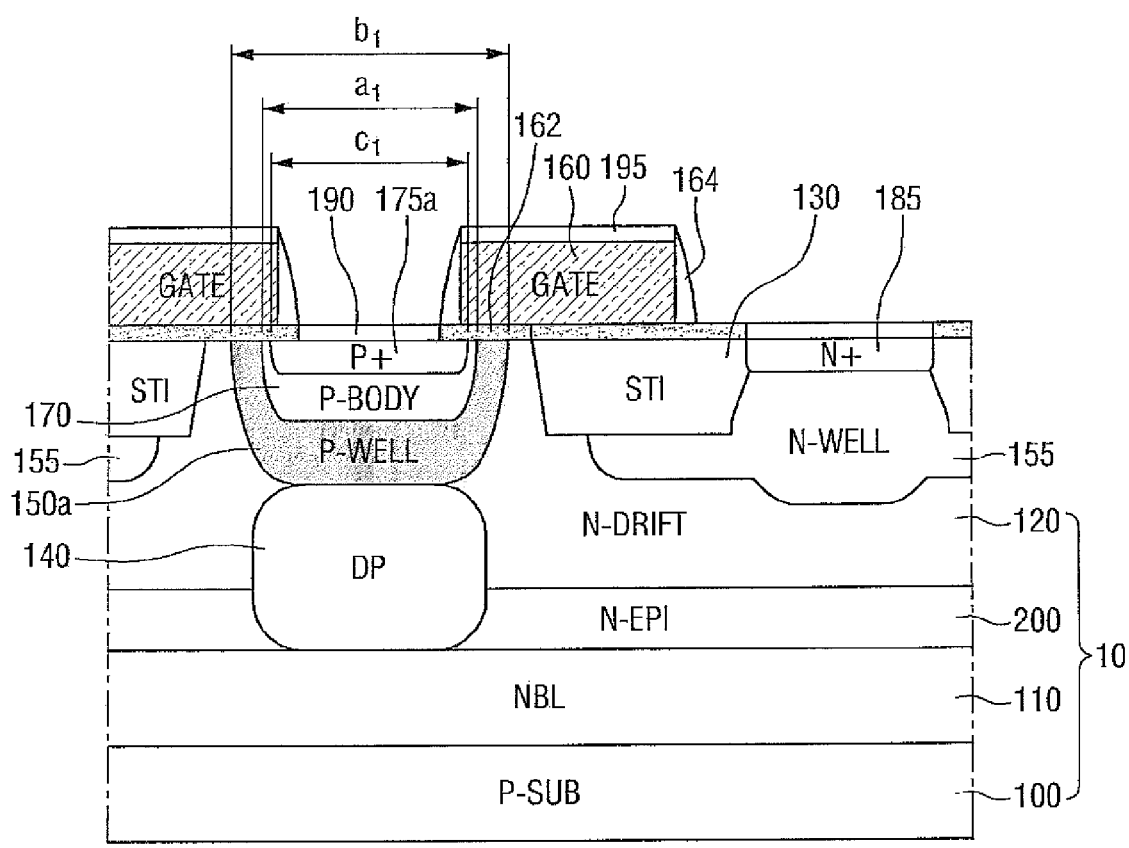
FIG. 14 is a cross-sectional view of the semiconductor device, taken along the Line D-D' of FIG. 11.
Figure 15:
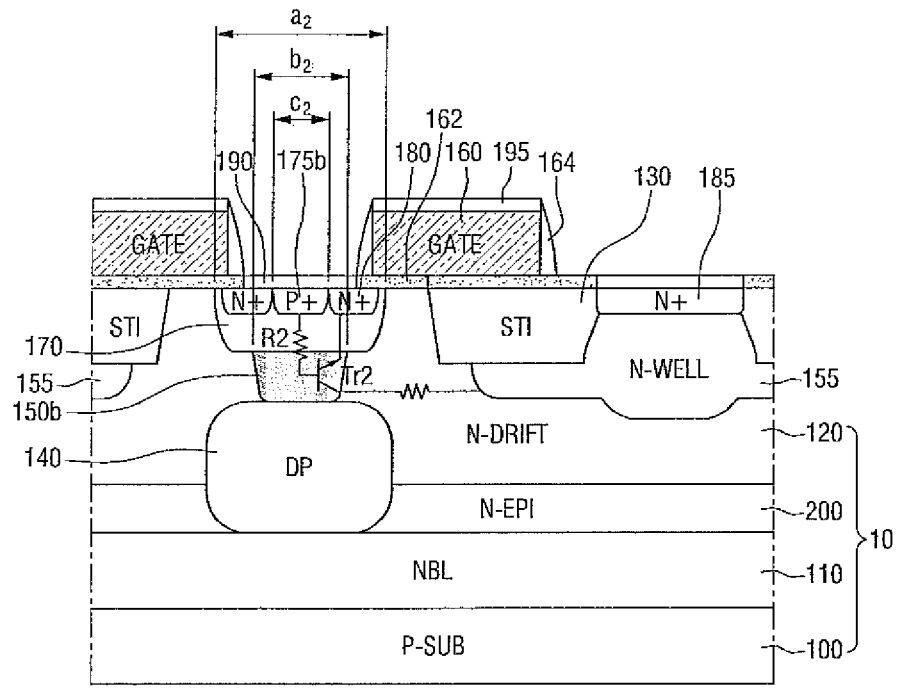
FIG. 15 is a cross-sectional view of the semiconductor device, taken along the line E-E' of FIG. 11.

A semiconductor device according to an exemplary embodiment of the present inventive concept will be described with reference to FIGS. 11 through 15. FIG. 11 is a perspective view of a semiconductor device according to an exemplary embodiment of the present inventive concept, a portion of which has been cut away. FIG. 12 is a conceptual plan view of the semiconductor device of FIG. 11. FIG. 13 is a conceptual plan view of some components of the semiconductor device of FIG. 11. FIG. 14 is a cross-sectional view of the semiconductor device, taken along the line D-D' of FIG. 11. FIG. 15 is a cross-sectional view of the semiconductor device, taken along the line E-E' of FIG. 11.

Unlike the semiconductor device according to the exemplary embodiment of FIGS. 1 through 10, the semiconductor device according to the current exemplary embodiment further includes a fishbone antenna-shaped body contact region 175 which is formed on a side of a source region 180 within a body region 170 and extends in a lengthwise direction of a P-type well 150. That is, both the P-type well 150 and the body contact region 175 are shaped like a fishbone antenna.

Referring to FIGS. 12 and 13, the body contact region 175 includes a first sub body contact region 175c which extends in a lengthwise direction of the body contact region 175 and a plurality of second sub body contact regions 175d which extend from opposite sides of the first sub body contact region 175c. The second sub body contact regions 175d extend from the first sub body contact region 175c in a direction perpendicular to the lengthwise direction of the body contact region 175. The second sub body contact regions 175d are arranged at regular intervals along the lengthwise direction of the body contact region 175. For example, a gap between neighboring second sub body contact regions 175d can be, but is not limited to, equal to a width of the second sub body contact regions 175d. Therefore, the first sub body contact region 175c corresponds to a transmission line of a fishbone antenna, and the second sub body contact regions 175d correspond to dipoles of the fishbone antenna.

The second sub body contact regions 175d protrude laterally with respect to the first sub body contact region 175c. Portions of the body contact region 175 in which the second sub body contact regions 175d are formed are relatively wider than portions of the body contact region 175 in which only the first sub body contact region 175c is formed.

Referring to FIGS. 11 and 13, unlike in the semiconductor device according to the exemplary embodiment of FIGS. 1 through 10, in the semiconductor device according to the current exemplary embodiment, the source region 180 is divided into a plurality of sections which are separated from each other and are arranged along the lengthwise direction of the P-type well 150. Each section of the source region 180 is interposed between neighboring second sub body contact regions 175d, and neighboring sections of the source region 180 are separated from each other by the second sub body contact regions 175d.

Consequently, the area of the body contact region 175 in the semiconductor device according to the current exemplary embodiment is increased compared with that of the body contact region 175 in the semiconductor device according to the exemplary embodiment of FIGS. 1 through 10, whereas the area of the source region 180 in the semiconductor device according to the current exemplary embodiment is reduced compared with that of the source region 180 in the semiconductor device according to the exemplary embodiment of FIGS. 1 through 10. The area of the body contact region 175 is increased by the area occupied by the second sub body contact regions 175d which protrude from the first sub body contact region 175c, whereas the area of the source region 180 is reduced by the area occupied by the second sub body contact regions 175d.

The fishbone antenna-shaped body contact region 175 according to the current exemplary embodiment is described in further detail with reference to FIGS. 14 and 15. The body contact region 175 located in a first region I is defined as a first body contact region 175a, and the body contact region 175 located in a second region II is defined as a second body contact region 175b.

As described above, the first region I refers to a region where the P-type well 150 is wider than the body region 170, and the second region II refers to a region where the P-type well 150 is narrower than the body region 170.

The semiconductor device according to the current exemplary embodiment includes the first body contact region 175a formed within a body region 170 in the first region I and the second body contact region 175b formed within a body region 170 in the second region II. A width c1 of the first body contact region 175a is greater than a width c2 of the second body contact region 175b. For example, the difference between the width c1 of the first body contact region 175a and the width c2 of the second body contact region 175b is equal to a width of the second sub body contact regions 175d formed on opposite sides of the first sub body contact region 175c.

The source region 180 is not formed in the first region I. In the first region I, the first body contact region 175a, which is wider than the second body contact region 175b, is formed.

Referring to FIGS. 11 and 12, in the semiconductor device according to the current exemplary embodiment, protruding regions of the P-type well 150 correspond to protruding portions of the body contact region 175. For example, in the first region I, both the P-type well 150 and the body contact region 175 have relatively large widths. In the second region II, both the P-type well 150 and the body contact region 175 have relatively small widths.

The semiconductor device according to the current exemplary embodiment is structured to delay the turn-on of a parasitic NPN transistor. For example, the fishbone-shaped P-type well 150 and the fishbone-shaped body contact region 175 provide paths, through which a hole current can flow out, in order to delay the turn-on of the parasitic NPN transistor. The effect of the P-type well 150 on delaying the turn-on of the parasitic NPN transistor is as described above.

In the semiconductor device according to the previous exemplary embodiment, the P-type body region 170 surrounds the N-type source region 180. In this semiconductor device, a region in which the P-type body region 170 and the N-type source region 180 are in contact with each other, that is, the bottom and sides of the N-type source region 180, has relatively higher resistance than other regions. In the semiconductor device according to the current exemplary embodiment, the sections of the N-type source region 180 which are separated from each other are arranged along the lengthwise direction of the P-type well 150. Thus, the area of the N-type source region 180 is reduced. In addition, the source region 180 is not formed in the first region I. That is, the first region I does not include an N-type source region 180 in contact with the P-type body region 170. This reduces base resistance R1 of a parasitic NPN transistor Tr1 in the first region I.

The base resistance of a parasitic NPN transistor is affected by the body contact region 175. Since the body contact region 175 is shaped like a fishbone antenna, the first body contact region 175a in the first region I is wider than the second body contact region 175b in the second region II. Accordingly, a cross section of the first body contact region 175a in the first region I is wider than that of the second body contact region 175b in the second region II. The magnitude of resistance is inversely proportional to the cross-sectional area of the body contact region. Therefore, the base resistance R1 of the parasitic NPN transistor Tr1 in the first region I is lower than base resistance R2 of a parasitic NPN transistor Tr2 in the second region II.

The base resistance R1 in the first region I is lower than the base resistance R2 in the second region II. Therefore, a hole current path is formed along the first region I with relatively low base resistance, thereby delaying the turn-on of a parasitic NPN transistor.

Figure 16:
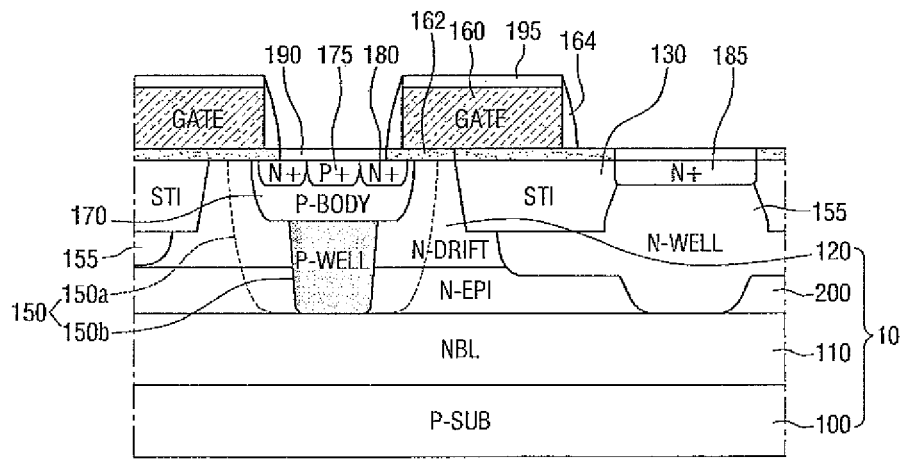
FIG. 16 is a cross-sectional view of a semiconductor device according to an exemplary embodiment of the present inventive concept.

A semiconductor device according to an exemplary embodiment of the present inventive concept will be described with reference to FIG. 16. FIG. 16 is a cross-sectional view of a semiconductor device according to an exemplary embodiment of the present inventive concept.

Unlike the semiconductor device according to the exemplary embodiment of FIGS. 1 through 10, the semiconductor device according to the current exemplary embodiment does not include a deep well 140. Therefore, a P-type well 150 is formed on a buried layer 110, and both sides of the P-type well 150 are in contact with an epitaxial layer 200 and a drift region 120.

A method of manufacturing a semiconductor device according to an exemplary embodiment of the present inventive concept is described with reference to FIGS. 17 through 25. FIGS. 17 through 25 are cross-sectional views for explaining a method of manufacturing a semiconductor device according to an exemplary embodiment of the present inventive concept.

Figure 17:
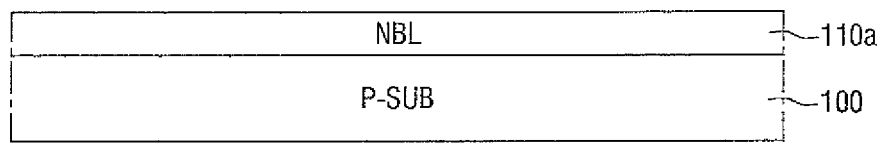
FIGS. 17 through 25 are cross-sectional views for explaining a method of manufacturing a semiconductor device according to an exemplary embodiment of the present inventive concept.

Referring to FIG. 17, a first buried layer 110a is formed in a P-type bulk substrate 100. Specifically, a mask pattern (not shown), in which a region in which the first buried layer 110a is to be formed is defined, is formed on the bulk substrate 100. Then, N-type impurities are injected into an upper region of the bulk substrate 100, and the mask pattern is removed to form the first buried layer 110a. Although not shown in the drawing, a P-type buried layer (not shown) can be formed on the P-type bulk substrate 100, if necessary.

Figure 18:
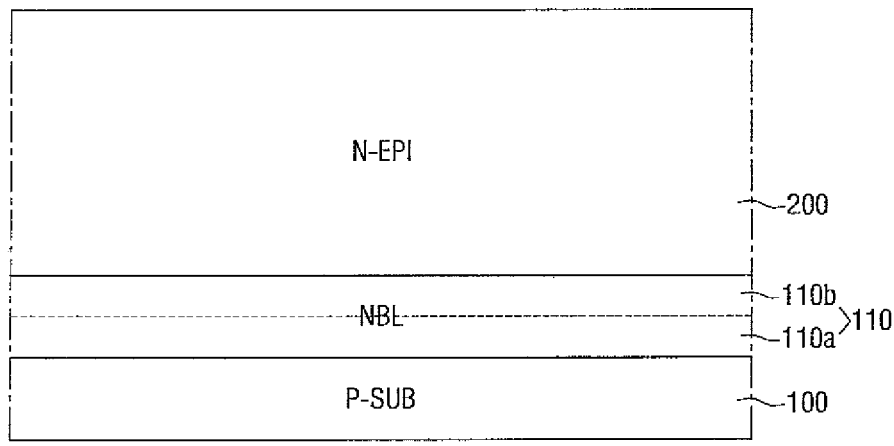

Referring to FIG. 18, an N-type epitaxial layer 200 is formed on a buried layer 110. The N-type epitaxial layer 200 can be formed using, for example, a selective epitaxial growth (SEG) method or a solid phase epitaxial (SPE) method. Impurities of the first buried layer 110a can diffuse to the epitaxial layer 200, thereby forming a second buried layer 110b. As a result, the buried layer 110 can be expanded.

Figure 19:
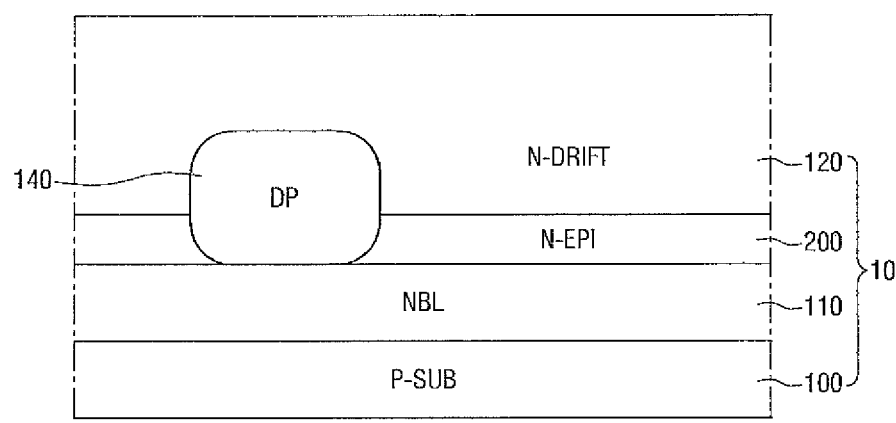

Referring to FIG. 19, an N-type drift region 120 is formed on the N-type epitaxial layer 200. A P-type deep well 140 is formed in the N-type epitaxial layer 200 and the drift region 120.

Specifically, a mask pattern (not shown), in which a region in which the drift region 120 is to be formed is defined, is formed, and N-type impurities are injected into an upper region of the epitaxial layer 200. Then, the mask pattern is removed to form the N-type drift region 120.

In addition, a mask pattern (not shown), in which a region in which a P-type deep well 140 is to be formed is defined, is formed on the N-type drift region 120, and P-type impurities are injected up to a top surface of the N-type buried layer 110 within a substrate 10. Then, the mask pattern is removed to form the P-type deep well 140.

Figure 20:
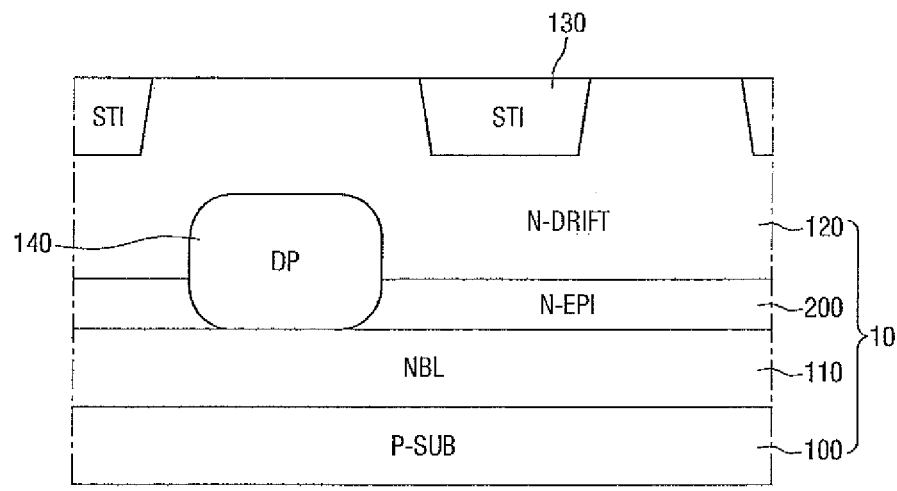

Referring to FIG. 20, an element isolation region 130 is formed in the N-type drift region 120. The element isolation region 130 can be formed using the STI method or the LOCOS method.

Figure 21:
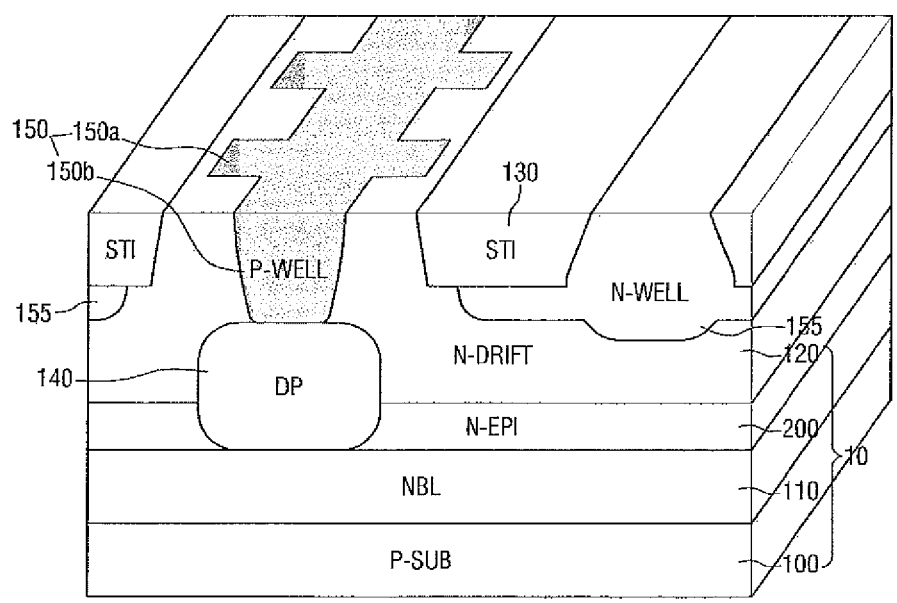

Referring to FIG. 21, a fishbone antenna-shaped P-type well 150 is formed in the N-type drift region 120 and on the P-type deep well 140. In addition, an N-type well 155 is formed in the N-type drift region 120.

Specifically, a mask pattern (not shown), in which a region in which the fishbone antenna-shaped P-type well 150 is to be formed is defined, is formed, and P-type impurities are injected up to a top surface of the P-type deep well 140 within the substrate 10. Then, the mask pattern is removed to form the fishbone antenna-shaped P-type well 150. A method of forming the N-type well 155 can be the same or substantially the same as the method of forming the P-type well 150, except that N-type impurities are injected.

Figure 22:
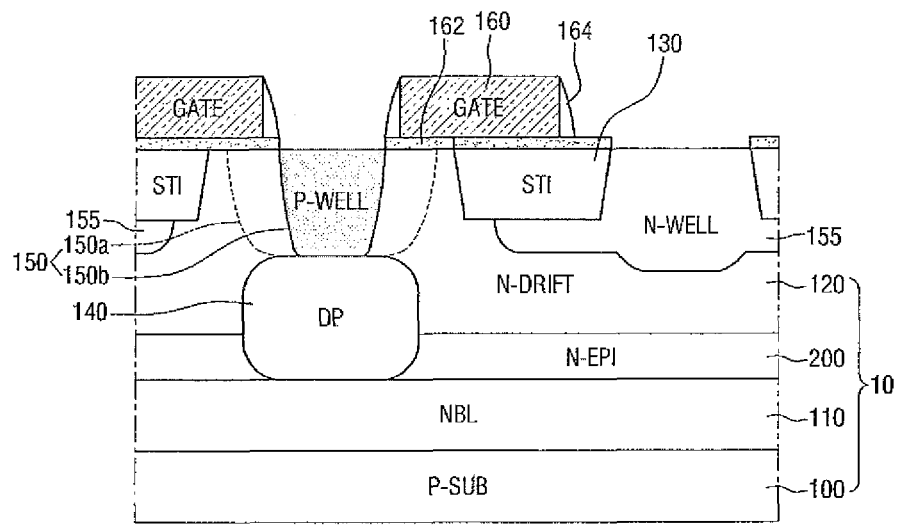

Referring to FIG. 22, a gate line 160 is formed on the substrate 10. A gate insulating film pattern 162 is formed between the gate line 160 and the substrate 10, and gate spacers 164 are formed on opposite side surfaces of the gate line 160.

Specifically, a pre-gate insulating film (not shown) and a pre-gate line (not shown) are sequentially stacked on the substrate 10 and then are patterned to form the gate insulating film pattern 162 and the gate line 160.

Figure 23:
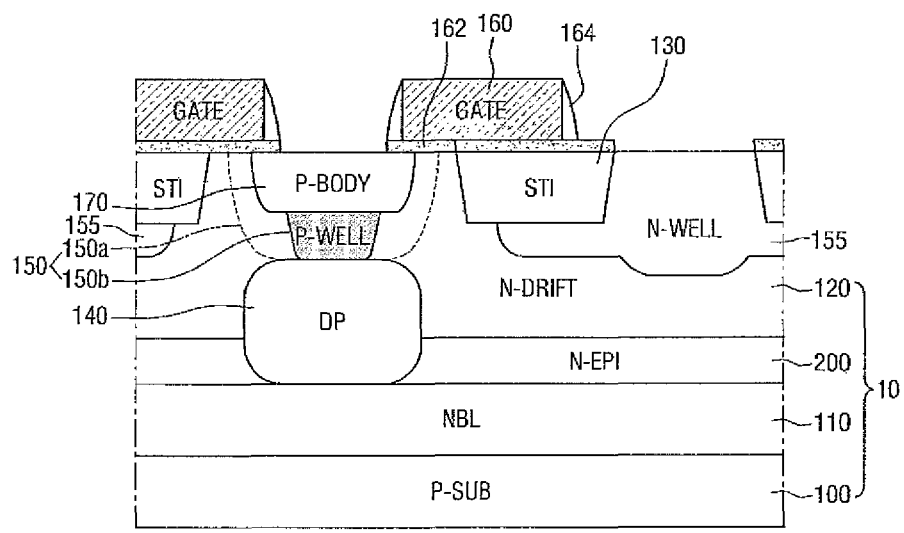

Referring to FIG. 23, a P-type body region 170 is formed in the P-type well 150. For example, the body region 170 is formed on a side of the gate line 160, specifically, between neighboring gate lines 160.

The body region 170 can be formed using a self-align method that uses the gate line 160. Specifically, P-type impurities are injected into the substrate 10 by using the gate line 160 as a mask. The body region 170 can have a higher concentration of P-type impurities than the P-type well 150.

Figure 24:
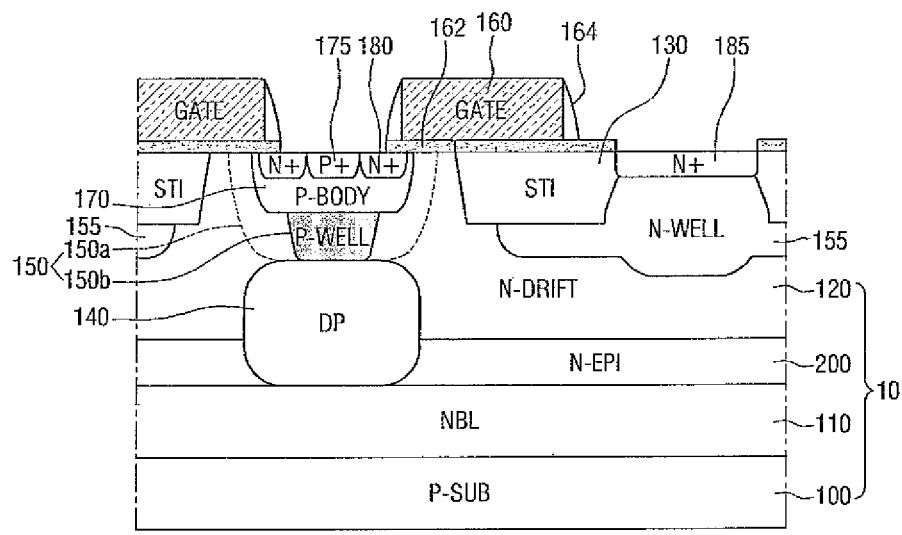

Referring to FIG. 24, a P-type body contact region 175 can be formed in the body region 170 by injecting P-type impurities into the substrate 10. By injecting N-type impurities into the substrate 10, an N-type source region 180 can be formed in the body region 170, and an N-type drain region 185 can be formed in the N-type well 155.

Figure 25:
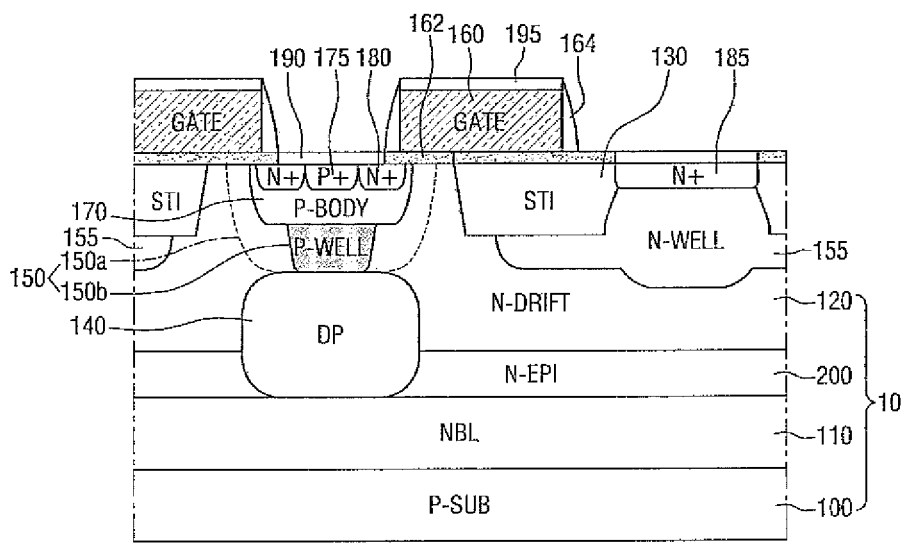

Referring to FIG. 25, a silicide film pattern 190 is formed on the source region 180, the body contact region 175 and the drain region 185. In addition, a gate hard film pattern 195 is formed on the gate line 160.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered as illustrative and not restrictive.

What is claimed is:

1. A method of fabricating a semiconductor device, the method comprising:

forming a P-type well having a first sun P-type well and a plurality of second sub P-type wells in a substrate, wherein the first sub P-type well is continuously extended in a first direction and wherein each pair of the plurality of second sub P-type wells is extended from both sides of the first sub P-type well in a second direction crossing the first direction and is arranged at a regular interval in the first direction;

forming a P-type body region having a first region and a second region in the substrate, wherein the P-type body region is extended in the first direction, wherein the first rat region of the P-type body region is formed on the first sub P-type well, wherein the second region of the P-type body region is surrounded by the each pair of the plurality of the second sub P-type wells, and wherein the P-type body region includes a source region and a body contact region; and forming a gate line on the substrate, wherein the gate line is extended in the first direction.

2. The method of claim 1, wherein the body contact region, the P-type body region, and the P-type well each includes P-type impurities, wherein the body contact, region has a higher concentration of the P-type impurities than the P-type body region having a higher concentration of the P-type concentration than the P-type well.

3. The method of claim 1, wherein the P-type well includes a first region having a first width and a second region having a second width greater than the first width, wherein the first sub P-type well is located at both the first and second region of the P-type well, wherein the each pair of the plurality of the second sub P-type wells is located in the second region of the P-type well, and wherein the first width and the second width are measured in the second direction.

4. The method of claim 3, wherein the P-type body region has a third width greater than the first width of the first region of the P-type well and smaller than the second width of the of the second region of the P-type well, wherein the third width is measured in the second direction.

5. The method of claim 1, wherein the P-type body region is formed by injecting P-type impurities using the gate line as a mask.

6. me method of claim 1, wherein the gate line overlaps part of the plurality of the second sub P-type wells and part of the source region, and the gate line is spaced apart from the first sub P-type well.

7. The method of claim 3, wherein the regular interval is substantially equal to a width of each of the plurality of the second sub P-type well.

8. The method of claim 1, wherein the source region includes a pair of sub source regions, wherein the body contact region is disposed between the pair of the sub source regions.

9. The method of claim 1, wherein the source region and the body contact region are extended in the first direction.

10. The method of claim 1, wherein the body contact region comprises a first body contact region and a plurality of second body contact regions, wherein the first body contact region is extended in the first direction and wherein each pair of the plurality of second body contact region is extended from both sides of the first body contact region and is arranged at a regular interval along the first direction.

11. The method of claim 10, wherein the first body contact region overlaps the first sub P-type well, wherein each of the plurality of the second body contact regions each overlaps each of the plurality of the second sub P-type wells.

12. The method of claim 10, wherein the source region includes a pair of sub source regions, wherein the first portion of the body contact region is disposed between the pair of the sub-source regions.

13. The method of claim 11, wherein the P-type well includes a first region having a first width and a second region having a second width greater than the first width, wherein the first sub P-type well is located at both the first and the second region, wherein the each pair of the plurality of the second sub P-type wells is located in the second region, and wherein the first width and the second width are measured in the second direction.

14. The method of claim 13, wherein the P-type body region has a third width greater than the first width of the first region of the P-type well and smaller than the second width of the second region of the P-type well, wherein the third width is measured in the second direction.

15. The method of claim 14, wherein the first body contact region has a fourth width smaller than the first width of the first region of the P-type well, wherein each of the plurality of the second body contact regions has a fifth width greater than the fourth width of the first body contact region and smaller than the second width of the second region of the P-type well, and wherein the fourth width and the fifth width are measured in the second direction.

16. The method of claim 1, further comprising:
   forming an N-type well in the substrate; and forming en isolation region in the substrate, wherein the P-type well is formed at one side of the isolation region and the N-type well is formed at an opposite side of the isolation region, wherein the gate line overlaps part of the isolation region, wherein the P-type well is spaced apart from the isolation region and wherein part of the N-type well is disposed under the isolation region.

17. The method of claim 16, further comprising:
   forming a drain region in the N-type well.

18. The method of claim 16, wherein the substrate includes a P-type substrate, an N-type buried layer formed in an upper part of the P-type substrate, an N-type epitaxial layer formed on the N-type buried layer, and an N-type drift region formed on the N-type epitaxial layer.

19. The method of claim 18, further comprising:
   forming a deep well on the N-type buried layer, wherein the deep well is disposed between the P-type well and the N-type buried layer, wherein the deep well is of P-type conductivity.

20. The method of claim 16, wherein the isolation region includes a shallow trench isolation structure.

* * * * *